United States Patent
Jun et al.

[11] Patent Number: 6,046,063
[45] Date of Patent: Apr. 4, 2000

[54] METHOD OF MANUFACTURING LIQUID CRYSTAL DISPLAY

[75] Inventors: Jung Mok Jun, Seoul; Bong Yeol Ryu, Kangwon-do; Jung Yeal Lee, Kyoungki-do, all of Rep. of Korea

[73] Assignee: Hyundai Electronics Industries Co., Ltd., Kyoungki-do, Rep. of Korea

[21] Appl. No.: 09/276,420

[22] Filed: Mar. 25, 1999

[30] Foreign Application Priority Data

Mar. 27, 1998 [KR] Rep. of Korea .................. 98-10826

[51] Int. Cl.⁷ ...................................................... H01L 21/00
[52] U.S. Cl. ............................................. 438/30; 438/155
[58] Field of Search .............................. 438/30, 149, 151, 438/155, 158, 161, 164, FOR 341; 349/38, 43, 42

[56] References Cited

U.S. PATENT DOCUMENTS

| | | | |
|---|---|---|---|
| 4,778,258 | 10/1988 | Park et al. .................................. | 349/43 |
| 5,238,861 | 8/1993 | Morin et al. .............................. | 438/155 |
| 5,561,440 | 10/1996 | Kitajima et al. .......................... | 345/87 |
| 5,580,796 | 12/1996 | Takizawa et al. ...................... | 438/158 |
| 5,771,083 | 6/1998 | Fugihara et al. ......................... | 349/147 |
| 5,828,433 | 10/1998 | Shin ........................................ | 349/147 |
| 5,830,785 | 11/1998 | Sanson et al. ........................... | 438/158 |
| 5,835,169 | 11/1998 | Kwon et al. .............................. | 349/38 |
| 5,998,230 | 12/1999 | Gee-Sung et al. ........................ | 438/30 |

FOREIGN PATENT DOCUMENTS

| | | |
|---|---|---|
| 6-230420 | 8/1994 | Japan . |
| 7-162007 | 6/1995 | Japan . |
| 9-218429 | 8/1997 | Japan . |
| 10-048667 | 2/1998 | Japan . |
| 10-078593 | 3/1998 | Japan . |

*Primary Examiner*—Michael Trinh
*Attorney, Agent, or Firm*—Ladas & Parry

[57] ABSTRACT

A method of manufacturing liquid crystal display (LCD), comprising the steps of: forming a bottom indium tin oxide (ITO) in a pixel area of a transparent insulating substrate; forming a gate line and a storage line spaced with each other, the storage line including a first part having a first width and a second part having a second width, the second part is formed in the central portion of the pixel region and the first part is formed in the both sides of the second part and is directly contacted with the bottom ITO; depositing a gate insulating layer over the entire surface of the substrate; forming a semiconductor layer on the gate insulating layer over the gate line; forming a data line being in perpendicular to the gate line, source and drain electrodes being overlapped with both side portions of the semiconductor layer and a conductive pattern being disposed over the second part of the storage line; depositing an organic insulating layer having lower dielectric constant on the entire surface of the substrate by a spin coating method; etching the organic insulating layer to form a contact hole so as to expose the conductive pattern; forming a top ITO on the organic insulating layer over the entire pixel area to be overlapped with portions of the gate line and the data line, the top ITO being in contact with the conductive pattern through the contact hole.

5 Claims, 3 Drawing Sheets

METHOD OF MANUFACTURING LIQUID CRYSTAL DISPLAY

BACKGROUND OF THE INVENTION

1. Field of the Invention

The present invention is related to a method of manufacturing liquid crystal display, more particularly to a method simplifying manufacturing process thereof.

2. Description of the Related Art

A Liquid Crystal Display, hereinafter LCD has been used as a display device for digital clock and calculator, recently used for television set and monitors also. More particularly, thin film transistor LCD, hereinafter TFT-LCD is likely used for display devices having a high resolution characteristic and large sized screen such as the Cathode Ray Tube (CRT) since the TFT-LCD has the characteristics of fast response time and is suitable for a device having a high-number of pixel element.

Meanwhile, an aperture ratio, a ratio of substantively transmitted light against the entire dimension of a pixel electrode has an effect on the displaying characteristics of LCDs. In general, the displaying characteristics of LCDs is enhanced when the aperture ratio is high. Accordingly, an LCD having an enhanced aperture ratio, for example FIG. 1 has proposed.

FIG. 1 is a plane view showing an LCD unit cell having a high aperture ratio according to conventional arts.

As shown in Fig.1, a gate line 2 and a storage line 4 are formed parallel in a row. A data line 8 is formed perpendicular to the gate line 2 and the storage line 4. The storage line 4 includes two parts, a first part 4a serving as a common signal line and a second part 4b serving as a storage capacitor, herein width of the second part 4b is larger than that of the first part 4a.

A TFT 15 is formed at an intersection of the gate line 2 and the data line 8. Herein, the TFT 15 includes a gate electrode extended from the gate line 2, a semiconductor layer 6 disposed on the upper of the gate electrode with sandwiching a gate insulating layer (not shown) and source and drain electrodes 9a, 9b both being overlapped with both side portions of the semiconductor layer 6 respectively.

A pixel electrode 12 of transparent metal such as Indium Tin Oxide, hereinafter ITO is formed at a pixel area defined by the gate line 2 and the data line 8. Herein, as shown in the drawings, the pixel electrode 12 overlaps with portions of the gate line 12 and the data line 8 and is connected to the source electrode 9a.

FIG. 2 is a cross-sectional view taken along the line II—II of FIG. 1. With reference to this drawing, a method of manufacturing liquid crystal display will be discussed.

A metal layer for gate line is deposited on a transparent insulating substrate, for example a glass substrate 20. A gate electrode 2a and a storage line 4 are formed by patterning the metal layer for gate line. A gate insulating layer 3 is deposited on the glass substrate 20 to covers the gate electrode 2a and the storage line 4. A pattern of semiconductor layer 6 is formed on the gate insulating layer over the gate electrode 2a.

A metal layer for data line is deposited on the semiconductor layer 6 and the gate insulating layer 3. A data line 8 and source and drain electrodes 9a and 9b are formed by patterning the metal layer for data line. As a result, a TFT 15 including the gate electrode 2a, the gate insulating layer 3, the semiconductor layer 6, the source and the drain electrodes is formed on a predetermined portion of the glass substrate 20.

An organic insulating layer 10 is coated over the above structure and a contact hole 19 is formed on the organic insulating layer 10 to expose the source electrode 9a by conventional photolithography techniques.

An ITO metal layer is deposited within the contact hole 19 and on the organic insulating layer 10, and a pixel electrode 12 is formed by patterning the ITO metal layer. The pixel electrode 12 overlaps with portions of the gate line and the data line 8 and is connected to the source electrode 9a.

As described above, the organic insulating layer 10 is used for insulating the data line 8 and the pixel electrode 12. More particularly, a material having lower dielectric constant is used so as to prevent deterioration of LCD displaying characteristics. If the material having lower dielectric constant is used as the organic insulating layer 10, because parasitic capacitance Cp between the data line 8 and the pixel electrode 12 which has overlapped with each other has nearly meaningless, this parasitic capacitance has no effect on the LCD driving.

Because in the LCD in FIG.1, the pixel electrode 12 is formed to be overlapped with the data line 8, the LCD having unit cell of the above structure has a superior aperture ratio to a conventional LCD whose pixel electrode is disposed within the pixel area.

However, the structure has also the drawback of deterioration in LCD displaying characteristics since capacitance C decreases due to use of an organic insulating layer of lower dielectric constant between the storage electrode and the pixel electrode. This is not a preferable structure since additional power supply is required for obtaining a desirable capacitance in the above LCD structure.

In the mean time, a conventional LCD having a double-layered ITO electrode structure which improves the aperture ratio and simultaneously prevents capacitance deterioration is proposed.

FIG. 3 is a plane view showing a unit cell of the LCD having double-layered ITO electrode structure.

As shown in the drawing, a gate line 22 and a storage line 24 are formed parallel in a row, and a data line 28 is formed perpendicular to the gate line 22 and the storage line 24. The storage line 24 includes a first part 24a and a second part 24b, both having a different width from each other.

A TFT 35 including a gate electrode extended from the gate line 22, a gate insulating layer (not shown), a semiconductor layer 26, source and drain electrodes 29a, 29b is formed at an intersection of the gate line 22 and the data line 28.

A first ITO electrode 30, hereinafter a bottom ITO is formed within a pixel area defined by the gate line 22 and the data line 28. A second ITO electrode 36, hereinafter a top ITO is formed to overlap with portions of the gate line 22 and the data line 28 and the top ITO is connected to the source electrode 29a. The top ITO is not yet connected to the second part 24b of the storage line 24 and the source electrode 29a.

The reference numeral 32 not described, is an additional conductive pattern for easily obtaining capacitance.

FIG. 4 is a cross-sectional view take along the line IV—IV of FIG. 3. With reference to the drawing, a method of manufacturing the same will be described.

A metal layer for gate line is formed on a glass substrate 40, and a gate line (not shown) and a storage line 24 is formed by patterning the metal layer for gate line. A gate insulating layer 25 is disposed on the glass substrate 40 to cover the storage line 24. As the gate insulating layer 25, a silicon oxide film SiO2 25a and a silicon nitride film SiON 25b are successively deposited in stack.

A first contact hole 27 is formed in the gate insulating layer 25 so as to expose the first part 24a of the storage line 24. An ITO metal layer is deposited within the first contact hole 27 and on the gate insulating layer 25. A bottom ITO 30 is formed within the pixel area by patterning the ITO metal layer. A data line 28 is formed on the gate insulating layer 25 by a conventional process. At this time, a conductive pattern 32 is also formed on the gate insulating layer 25 over the second part 24b of the storage line 24.

Not shown in the drawing, a semiconductor layer is formed on a predetermined region prior to form the data line 28 and source and drain electrodes together with the date line 28 also formed so that a TFT is formed at an intersection of the gate line 22 and the data line 28.

Continuously, an organic insulating layer 34 having lower dielectric constant is formed on the entire surface of the substrate. A second contact hole 39 is formed in the organic insulating layer 34 so as to expose the conductive pattern 32. An ITO metal layer is formed within the second contact hole 39 and on the organic insulating layer 34, and a top ITO 36 is formed by patterning the ITO metal layer. The top ITO 36 is formed over the entire pixel area so as to be overlap with portions of the gate line 22 and the data line 28.

The LCD having a double-layered structure obtains its main capacitance Cm between the top ITO 36 and the storage line 24 while sandwiching the gate insulating layer 25 and auxiliary capacitance Ca between the bottom ITO 30 in contact with the storage line 24 and the top ITO 36 while sandwiching the organic insulating layer 34. Consequently, decrease in capacitance caused by sandwiching the organic insulating layer 34 having lower dielectric constant, is prevented. The LCD having the above structure can obtain a high aperture ratio and a high capacitance.

However, the LCD capable of preventing the capacitance decrease also has a drawback that an additional manufacturing process for connecting the storage line and the bottom ITO, i. e. etching step is required. Especially, the etching step needs further etching mask, which leads to an increase in the manufacturing cost.

SUMMARY OF THE INVENTION

The object of the invention is to provide a method of manufacturing LCD capable of simplifying its manufacturing process.

So as to accomplish the above object, a method of manufacturing liquid crystal display(LCD), comprising the steps of: forming a bottom indium tin oxide (ITO) in a pixel area of a transparent insulating substrate; forming a gate line and a storage line spaced with each other, the storage line including a first part having a first width and a second part having a second width, the second part is formed in the central portion of the pixel region and the first part is formed in the both sides of the second part and is directly contacted with the bottom ITO; depositing a gate insulating layer over the entire surface of the substrate; forming a semiconductor layer on the gate insulating layer over the gate line; forming a data line being in perpendicular to the gate line, source and drain electrodes being overlapped with both side portions of the semiconductor layer and a conductive pattern being disposed over the second part of the storage line; depositing an organic insulating layer having lower dielectric constant on the entire surface of the substrate by a spin coating method; etching the organic insulating layer to form a contact hole so as to expose the conductive pattern; forming a top ITO on the organic insulating layer over the entire pixel area to be overlapped with portions of the gate line and the data line, the top ITO being in contact with the conductive pattern through the contact hole.

The bottom ITO is formed 50% to 60% of dimension of the pixel area. The organic insulating layer is a resin layer having the dielectric constant of 2.5 to 3.6 and a thickness of 1 to 3 $\mu$m.

DETAILED DESCRIPTION OF THE INVENTION

Figure 1:
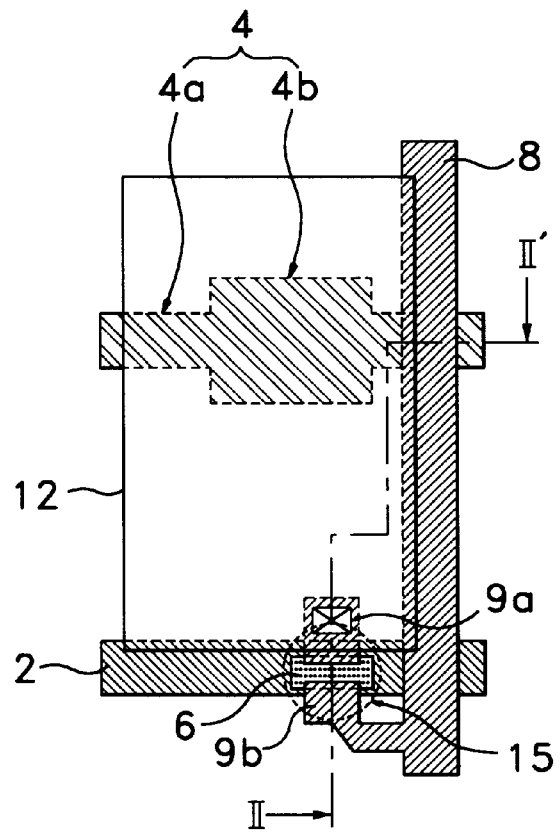
FIG. 1 is a plane view showing an LCD unit cell having a high aperture ratio according to conventional arts.
Figure 2:
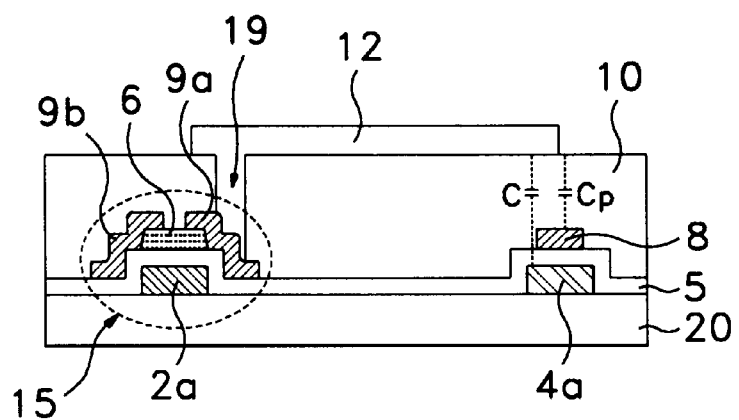
FIG. 2 is a cross-sectional view taken along the line II—II of FIG. 1.
Figure 3:
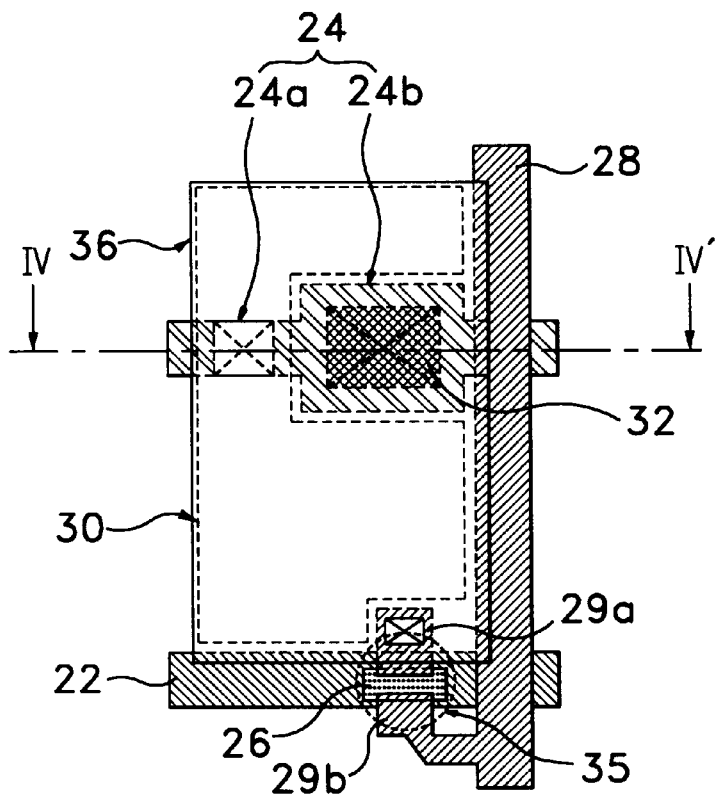
FIG. 3 is a plane view showing a unit cell of the LCD having double-layered ITO electrode structure.
Figure 4:
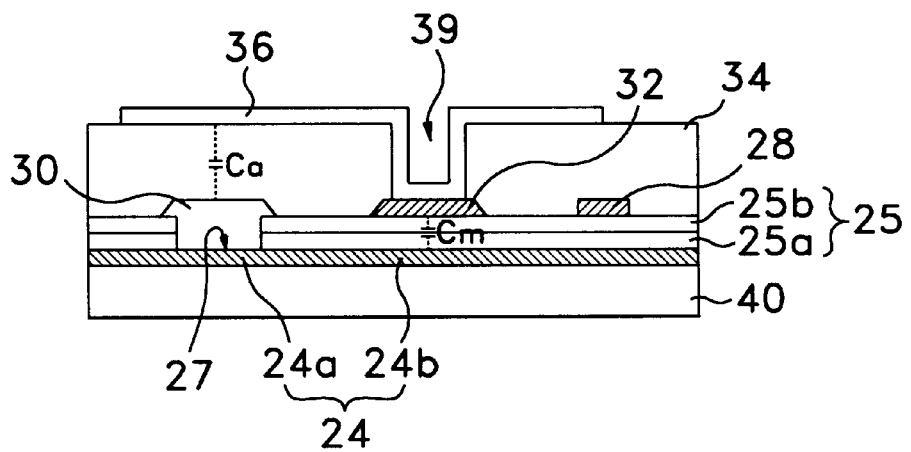
FIG. 4 is a cross-sectional view take along the line IV—IV of FIG. 3.
Figure 5:
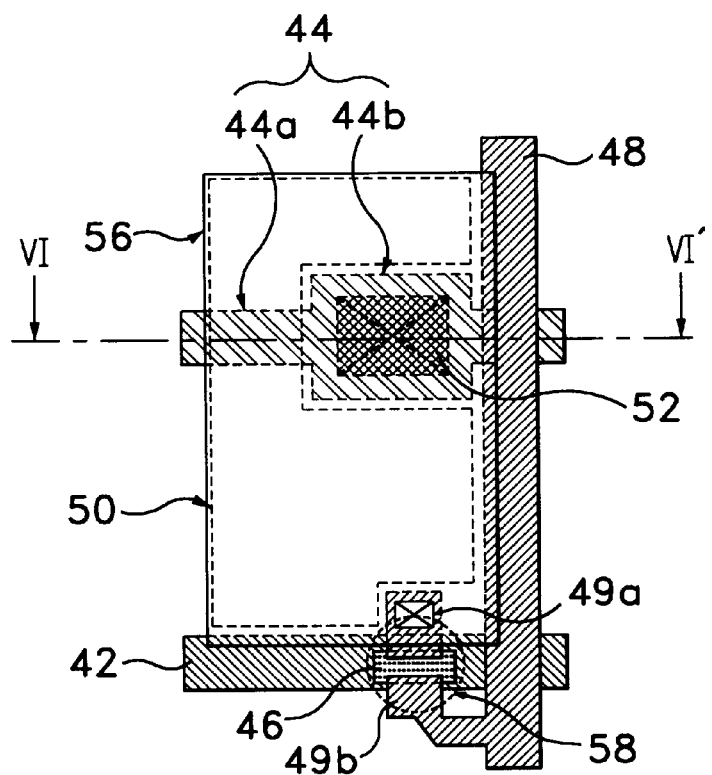
FIG. 5 is a plane view showing a unit cell of an LCD having a double-layered structure according to the embodiment of the present invention.

FIG. 5 is a plane view showing a unit cell of an LCD having a double-layered structure according to the embodiment of the present invention.

A bottom ITO 50 is formed within the pixel area by that way shown in the drawing. The bottom ITO 50 is preferably 50% to 60% of dimension of the pixel area. A gate line 42 is formed horizontally not to contact with the bottom ITO 50 so that the pixel area to be defined. A storage line 44 is disposed across the pixel area and is in parallel to the gate line 42. The storage line 44 includes a first part 44a of a first width and a second part 44b of a second width which is larger than the first width. The first part 44a of the storage line 44 acts as a common signal line and the second part 44b forms a capacitance with conductive pattern which is to be formed later. At that time, as shown in the drawing, the second part 44b of the storage line 44 is disposed in the central region of the pixel area adjacent to the data line 48 and the first part 44a of the storage line 44 is disposed in both sides of the second part 44b and the first part 44a is directly contacted to the bottom ITO 50. The data line 48 which defines the pixel area together with the gate line 42 is formed perpendicular to the gate line 42 and the storage line 44.

A semiconductor layer 46 is disposed in forms of a pattern on the gate line 42 adjacent to the intersection of the gate line 42 and the data line 48. Herein, a gate insulating layer (not shown) is formed for insulating the gate line 42 and the semiconductor layer 46 therebetween. A source electrode 49a and a drain electrode 49b both overlaps with both side portions of the semiconductor layer 46 respectively. The source electrode 49a is extended to one side portion of the semiconductor layer 46 from the pixel area, and the drain electrode 49b is extended from the data line 48 to the other side portion of the semiconductor layer 46. As a result, a TFT 58 is formed at an intersection of the gate line 42 and the data line 48, which includes the gate electrode, the semiconductor layer 46, a gate insulating layer (not shown) and source and drain electrodes 49a and 49b.

A conductive pattern 52 is disposed over the second part 44b of the storage line 44, and a top ITO 56 is disposed over the entire surface of the substrate to be connected to the conductive pattern 52 and to be overlapped with portions of the gate line 42 and the data line 48.

Figure 6:
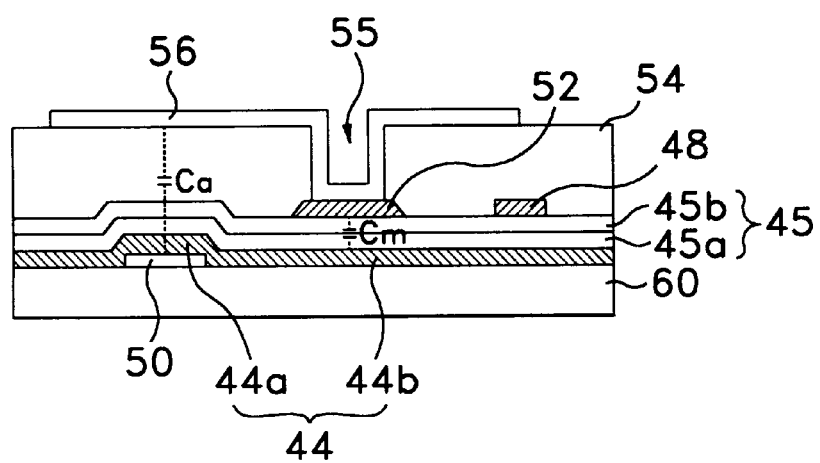
FIG. 6 is a cross-sectional view taken along the line VI—VI of FIG. 5.

FIG. 6 is a cross-sectional view taken along the line VI—VI of FIG. 5. With reference to this drawing, the manufacturing method will be described.

An ITO metal is deposited on a transparent insulating substrate, for example a glass substrate 60. A bottom ITO 50 is formed by patterning the ITO metal. The bottom ITO 50, as mentioned earlier, is preferably 50% to 60% of dimension of the pixel area. The bottom ITO 50 is not formed at the region of the storage line in which a second part is to be formed in the afterward steps. A metal layer for gate line is disposed over the surface of the glass substrate 60 including the bottom ITO 50 and patterned to form a gate line(or gate electrode, not shown) and a storage line 44 including a first part 44a acting as a common signal line and a second part 44b forming a capacitance with a conductive pattern which is to be formed later. At that time, the first part 44a of the storage line 44 is directly connected to the bottom ITO 50. At this time, the first part 44a of the storage line 44 is directly contacted with the bottom ITO 50.

Conventionally, there is required an additional manufacturing step for contacting the first part 44a and the bottom ITO 50, i. e. an etching step for making a contact hole. However, the present invention does not require such step due to direct contact of the first part 44a with the bottom ITO 50. Accordingly, the manufacturing method according to the embodiment of the present invention enables simplification in manufacturing process and lowers manufacturing cost since no etching mask is required.

A gate insulating layer 45 is deposited over the glass substrate 60 including the storage line 44. As the gate insulating layer 45, a silicon oxide film SiO2 45a and a silicon nitride film SiON 45b are successively deposited in stack.

A metal layer for data line is disposed on the gate insulating layer 45. A data line 48 is formed by patterning the metal layer for data line and disposed perpendicular to the storage line 44 and the gate line(not shown) . At that time, a source electrode and a drain electrode of the ITO both not shown are formed together with the data line 48. A conductive pattern 52 is preferably formed together with the data line 48. The conductive pattern 52 is disposed on the gate insulating layer 45 over the second part 44b of the storage line 44. The conductive pattern 52 is formed so as to easily obtain the capacitance between the second part 44b of the storage line 44 and a top ITO which is to be formed later.

In the mean time, a semiconductor layer, although not shown in the drawings, is formed at a predetermined part i. e. on the gate insulating layer over the gate line which is adjacent to the intersection of the gate line and the data line. Then the source and the drain electrodes are formed to be overlapped with both sides of the semiconductor layer. As a result, a TFT is formed at the intersection of the gate line and the data line.

Continuously, an organic insulating layer 54 is formed on the entire structure according to the spin coating method. The organic insulating layer 54 is an insulating layer, for example a resin having lower dielectric constant approximately 2.5 to 3.6. A resin 54 is formed at a thickness of 1 to 3μm. A contact hole 55 is formed on the resin layer 54 so as to expose the conductive pattern 52 according to a conventional etching method. An ITO metal layer is formed within the contact hole 55 and on the resin layer 54, and a top ITO 56 is formed by patterning the ITO metal layer. The top ITO 56 is contacted with the conductive pattern 52 through the contact hole 55. The top ITO 56 is formed over the entire pixel area so as to overlap with portions of the gate line(not shown) and the data line 48.

The LCD having a double-layered ITO electrode structure can obtains high aperture ratio since the top ITO 56 is disposed over the entire pixel area. The LCD having a double-layered structure can obtain its main capacitance Cm between the top ITO 56 and the storage line 44 and auxiliary capacitance Ca between the bottom ITO 52 and the top ITO 56. Consequently, decrease in capacitance caused by sandwiching the organic insulating layer 54 having lower dielectric constant, is prevented. Furthermore, the bottom ITO 50 and the storage electrode 44 are directly contact with each other without incurring additional step, therefore the present invention provides simple manufacturing process and decrease in manufacturing cost.

While the invention has been particularly shown and described with respect to preferred embodiment thereof, it will be understood by those skilled in the art that various changes in form and details may be made therein without departing from the spirit and the scope of the invention as defined by the following claims.

We claim:

1. A method of manufacturing liquid crystal display (LCD), comprising the steps of:

forming a bottom indium tin oxide (ITO) in a pixel area of a transparent insulating substrate;

forming a gate line and a storage line spaced with each other, the storage line including a first part having a first width and a second part having a second width, the second part is formed in the central portion of the pixel region and the first part is formed in the both sides of the second part and is directly contacted with the bottom ITO;

depositing a gate insulating layer over the entire surface of the substrate;

forming a semiconductor layer on the gate insulating layer over the gate line;

forming a data line being in perpendicular to the gate line, source and drain electrodes being overlapped with both side portions of the semiconductor layer and a conductive pattern being disposed over the second part of the storage line;

depositing an organic insulating layer having lower dielectric constant on the entire surface of the substrate by a spin coating method;

etching the organic insulating layer to form a contact hole so as to expose the conductive pattern;

forming a top ITO on the organic insulating layer over the entire pixel area to be overlapped with portions of the gate line and the data line, the top ITO being in contact with the conductive pattern through the contact hole.

2. The method as claimed in claim 1, wherein the bottom ITO is formed 50% to 60% of dimension of the pixel area.

3. The method as claimed in claim 1, wherein the organic insulating layer has the dielectric constant of 2.5 to 3.6.

4. The method as claimed in claim 3, wherein the organic insulating layer is a resin layer.

5. The method as claimed in claim 1, wherein the organic insulating layer is coated at thickness of 1 to 3 μm.

* * * * *